US006421804B1

(12) United States Patent
Lee

(10) Patent No.: US 6,421,804 B1
(45) Date of Patent: Jul. 16, 2002

(54) GENERATING RELIABILITY VALUES FOR ITERATIVE DECODING OF BLOCK CODES

(75) Inventor: Inkyu Lee, Kearny, NJ (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/468,400

(22) Filed: Dec. 20, 1999

(51) Int. Cl.$^7$ .............................................. H03M 13/29
(52) U.S. Cl. ...................................... 714/755; 714/780
(58) Field of Search .................................. 714/755, 780

(56) References Cited

U.S. PATENT DOCUMENTS

| 5,563,897 A | | 10/1996 | Pyndiah et al. ............ 371/37.4 |
| 6,038,696 A | * | 3/2000 | Chouly et al. ............... 375/261 |
| 6,065,147 A | * | 5/2000 | Pyndiah et al. ............. 700/251 |

OTHER PUBLICATIONS

Goalic et al., "Real–Time Turbo–Decoding of Product Codes on a Digital Signal Processor", 1997 GLOBECOM, pp. 624–628.*
Lucas et al., "On Iterative Soft–Decision Decoding of Linear Binary Block Codes and Product Codes", IEEE Journal on Selected Areas in Communications, vol. 16, No. 2, Feb. 1998, pp. 276–296.*
Sweeney et al., "A Multidimensional Block Coding Scheme with Iterative Decoding", IEE Colloquium on Turbo Codes in Digital Broadcasting, Nov. 1999, pp. 15/1–15/6.*
"Iterative Decoding Of Binary Block and Convolutional Codes" by Joachim Hagenauer, *Fellow, IEEE*, Elke Offer, and Lutz Papke, *IEEE Transactions On Information Theory*, vol. 42, No. 2, Mar. 1996, pp. 429–445.

* cited by examiner

*Primary Examiner*—Stephen M. Baker
(74) *Attorney, Agent, or Firm*—Steve Mendelsohn; Ian M. Hughes

(57) ABSTRACT

An iterative decoder arranges calculation of updated reliability values for a current iteration of an iterative decoder so as to reduce the number of comparison operations. The variables for the magnitude and sign of the updated reliability value are initialized. A search of the previous reliability values generates first and second minimum magnitude values for each row (if the iterative decoder is decoding in the horizontal direction) or column (if the iterative decoder is decoding in the vertical direction). A test determines whether the magnitude of the previous reliability value is greater than the first minimum magnitude value $m_1$. If so, the magnitude of the updated reliability value is set as the value $m_1$. Otherwise, the magnitude of the updated reliability value is set as the second minimum magnitude value $m_2$. The sign of the updated reliability value is tracked and assigned once the updated reliability value is set.

15 Claims, 2 Drawing Sheets

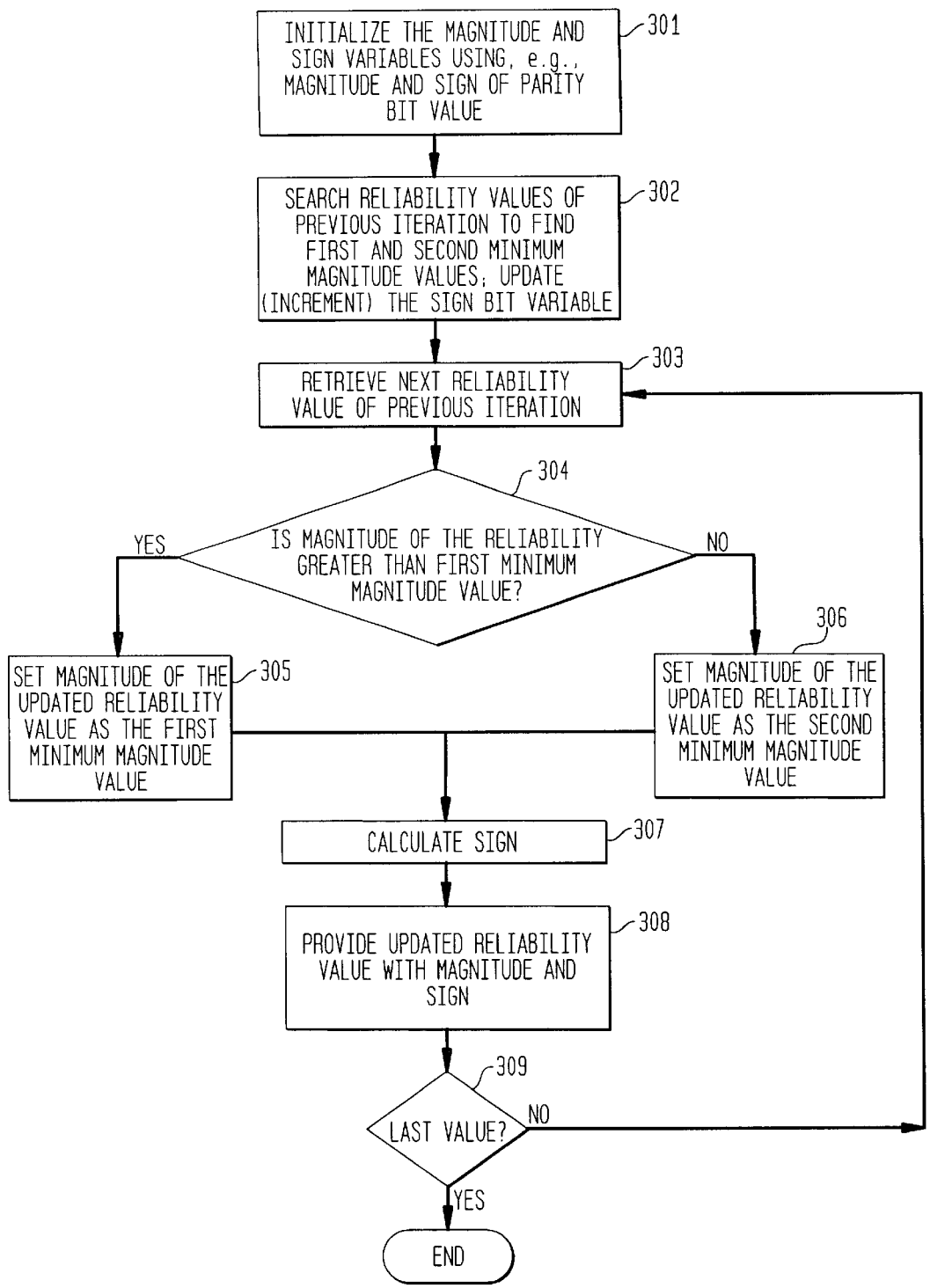

GENERATING RELIABILITY VALUES FOR ITERATIVE DECODING OF BLOCK CODES

BACKGROUND OF THE INVENTION

1. Field of the Invention

The present invention relates to decoding data in communication or recording systems, and, more particularly, to iterative decoding of block codes.

2. Description of the Related Art

Encoding data with two-dimensional (or higher) block codes and iterative decoding of the encoded data are employed in many systems due to the relatively high coding gain and simple structure of the decoder. Concatenated and product codes may be employed for encoding of data. For these types of codes, two (known as 2-dimensional) or more (N-dimensional) block codes (known as component codes) are combined to create more powerful encoding schemes.

The following definitions may be of use to understand the encoding and decoding methods. A set of binary values U is defined in the Galois field-2 (GF(2)) with elements $\{+1, -1\}$ where +1 is the "null" element under modulo-2 addition. The reliability value, or soft value, L(u) is the log-likelihood ratio of the binary random values in U and is defined as the (natural) log of the ratio of the probability that the random variable U takes on the value u=+1 to the probability that the random variable U takes on the value u=−1. The sign of L(u) is used as a hard decision by a detector, and the magnitude of L(u) is used as a reliability statistic (value) for the hard decision. Each binary value u (user data information bit) is encoded to generate coded bits x with soft values L(x). For an (K, N)-systemic code, K bits are equal to the information bits u and (N-K) bits in x contain the parity information.

For example, a product code may employ a one parity-bit check code that, for the 2-dimensional case, encodes two data words having $K_1$ and $K_2$ information bits, respectively ($K_1$ and $K_2$ are integers greater than 0). The product code encoding of the data (i.e., the $K_1 \cdot K_2$ information bits) are ordered in a rectangular matrix u as shown in FIG. 1, and the encoding may be a row vector (e.g., $K_1$ information bits) by column vector (e.g., $K_2$ information bits) combination (e.g. GF(2) addition, multiplication, or other linear operation of the binary values) to form the rectangular matrix u. The product code encoding of the data also includes row- and column-wise parity bits $p^r$ and $p^c$, respectively. For block codes used as the component codes, for example, encoding $K_1$ and $K_2$ information bits in the horizontal and vertical direction, the encoding may be as follows. Horizontal rows are formed from $K_2$ code words of a ($K_1$, $N_1$) block code $C^r$ having rate $R_1=(K_1/N_1)$ (here, $N_1$ is the total length of a row, and the length of the parity bit information is $N_1-K_1$). Vertical columns are formed from $K_1$ code words of a ($K_2$, $N_2$) block code $C^c$ having rate $R_2=(K_2/N_2)$ (here, $N_2$ is the total length of a column, and the length of the parity bit information is $N_2-K_2$).

Iterative decoding methods may employ "soft-in, soft-out" decoders for decoding data encoded using block codes, such as the product code described above. In an iterative decoding method, a block of encoded data is repetitively decoded by two or more decoding modules until a predetermined number (I) of decoding iterations are complete. In an iterative decoding scheme, the reliability values based on the information are updated at each iteration, utilizing the information extracted from the previous iteration process. Iterative decoding of concatenated and product codes using soft-in, soft-out information is well known in the art and is described in, for example, J. Hagenauer, E. Offer, and L. Papke, *Iterative Decoding of Block and Convolutional Codes*, I.E.E.E. Transactions on Information Theory, Vol. 42, No. 2, March 1996 whose teachings are incorporated herein.

A soft-in, soft-out decoder decodes soft-input information received as channel values (received sample values $L_c \cdot y$) from a transmission medium (the medium may be modeled with constant reliability $L_c$ operating on values y) as well as calculated a priori reliability values $L_p(u)$ for the information bits u. Decoding produces a posteriori reliability values for the output, decoded data. The a priori reliability values $L_p(u)$ may either be 0 for the first iteration (since there is no a priori information) or, after the first iteration, extrinsic reliability values $L_e(u)$ for the information bits from a previous iteration. The extrinsic reliability values $L_e(u)$ are values based on indirect information contained in the parity bits for an information bit, and may be generated from the a posteriori reliability values.

For each decoding iteration, the decoder completes a decoding operation for each component code of the product code. For the exemplary 2-dimensional product code, decoding of horizontal (row) values uses the input sample values $L_c \cdot y$ and a priori reliability values $L_p(u)$ to generate output a posteriori row values $L^r(u)$ and the extrinsic row values $L^r_e(u)$. Next, decoding of vertical (column) values uses the input sample values $L_c \cdot y$ and the extrinsic row values $L^r_e(u)$ to generate output a posteriori column values $L^c(u)$ and extrinsic column values $L^c_e(u)$ before advancing to the next iteration. The extrinsic values $L^c_e(u)$ may then be used as a priori reliability values $L_p(u)$ for the next iteration. For the last iteration, the output a posteriori values of the last component code decoder are provided as the final decision values $L_f(u)$ corresponding to the decoded sample values.

After each decoding operation (e.g., horizontal or vertical) during each iteration of the decoder, the various defined reliability values (e.g., a posteriori or extrinsic reliability values) must be updated for the next decoding operation (unless the decoding has finished). For an iterative decoder with 2-dimensional parity check product codes having $K_1 \cdot K_2$ information bit matrix u, each iteration of the decoder calculates an updated reliability value for the current iteration from the reliability values of the previous operation as follows. The value $u_{ij}$ is defined as the (i,j) th value of the ($K_1 \cdot K_2$ information bit) matrix u, and the values $p_i^r$ and $p_j^c$ are defined as the i th row parity bit and the j th column parity bit, respectively. The updated reliability value for $u_{ij}$ ($L(u_{ij})$) for the current iteration of the decoder may be approximated as given in equations (1) and (2):

$$L(u_{ij}) \approx \left( \prod_{k \neq i} \text{sign}(L'(u_{kj})) \right) \min_{k \neq i}(|L'(u_{kj})|, |L'(p_i^r)|), \quad 1 \leq i \leq K_1 \quad (1)$$

$$L(u_{ij}) \approx \left( \prod_{k \neq j} \text{sign}(L'(u_{ik})) \right) \min_{k \neq j}(|L'(u_{ik})|, |L'(p_j^c)|), \quad 1 \leq j \leq K_2 \quad (2)$$

where L'(*) represents the reliability value obtained from the previous iteration. For iterative decoders of the prior art implementing the calculations of equations (1) and (2), a total of $K_1^2 K_2 + K_1 K_2^2$ comparators are required to compute the updated reliability value for a $K_1$ by $K_2$ information matrix u.

SUMMARY OF THE INVENTION

The present invention relates to generating an updated set of reliability values in an iterative decoder for each dimension of block encoded data. It is an object of the present invention to generate the updated set of reliability values while reducing the number of and complexity of calculations. For an exemplary 2-dimensional product code, an implementation of an iterative decoder employing an exemplary embodiment may use$(K_1K_2+K_1K_2)$ comparators rather than $(K_1^2K_2+K_1K_2^2)$ comparators as required in the prior art.

An embodiment of the present invention searches a current set of reliability values in a dimension of block-encoded data to 1) identify first and second minimum magnitude reliability values and 2) update each sign of the current set of reliability values. For the set of current reliability values, the magnitude of each current reliability value is compared to the first minimum magnitude value and a resulting operation performed based on the comparison. If the current reliability value is greater than the first minimum magnitude value, the magnitude of the updated reliability value corresponding to the current reliability value is set to the first minimum magnitude value; otherwise, the magnitude of the updated reliability value corresponding to the current reliability value is set to the second minimum magnitude value. A sign bit is associated with the magnitude set for each reliability value to provide an updated reliability value.

BRIEF DESCRIPTION OF THE DRAWINGS

Other aspects, features, and advantages of the present invention will become more fully apparent from the following detailed description, the appended claims, and the accompanying drawings in which:

FIG. 3 shows a flow diagram of an exemplary method of computing updated reliability values.

DETAILED DESCRIPTION

In accordance with exemplary embodiments of the present invention, an iterative decoder searches rows or columns to determine a set of one or more reliability values of a previous iteration having relative minimum values. These relatively minimum values are then selectively used to update the reliability values for the current iteration. An iterative decoder employing the present invention updates reliability values $u_i(L(u_i))$ for each dimension (component block code) during a current iteration using equation (3):

$$L(u_i) \approx \left(\prod_k \text{sign}(L'(u_k))\right) \min(|L'(u_k)|, |L'(p_i^r)|), \quad 1 \leq i \leq K_N \quad (3)$$

where N is the dimension and $K_N$ is the number of elements of the data for the dimension (e.g., number of reliability values in a row of N-dimensional encoded information bits) and K, N, and i are positive integers.

Figure 1:
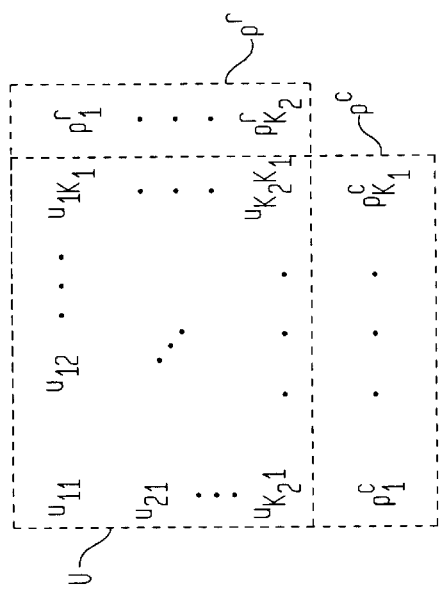
FIG. 1 shows a prior art encoding with a product code of $K_1 \cdot K_2$ information bits that are ordered in a rectangular matrix with adjacent parity value vectors.

For the exemplary embodiment, product encoded $K_1 \cdot K_2$ information bits are ordered in a rectangular matrix u with row- and column-wise parity bit vectors $p^r$ and $p^c$ such as shown and described with respect to FIG. 1. The value $u_{ij}$ is defined as the (ij) th value of the ($K_1 \cdot K_2$ information bit) matrix u, and the values $p_i^r$ and $p_j^c$ are defined as the j th row parity bit and the j th column parity bit, respectively. In general, the component (block) codes, the number of parity bits or the method by which the parity bits are generated may be set arbitrarily. For example, in addition to row and column parity bits, a third parity bit for information bits in a diagonal direction may be also used in order to improve the coding gain.

Although the present invention is described with respect to calculating reliability values of product encoded $K_1 \cdot K_2$ information bits, the present invention is not so limited. As would be apparent to one skilled in the art, the techniques described herein may be extended to other forms of encoding with block codes in which reliability values are updated for each iteration of the decoder. For alternative embodiments, the reliability values are updated for each dimension (i.e., by searching rows or columns in the 2-dimensional case) to determine one or more reliability values of a previous iteration having relative minimum values, and then selectively using the relatively minimum values to update the reliability values for the current iteration.

Figure 2:
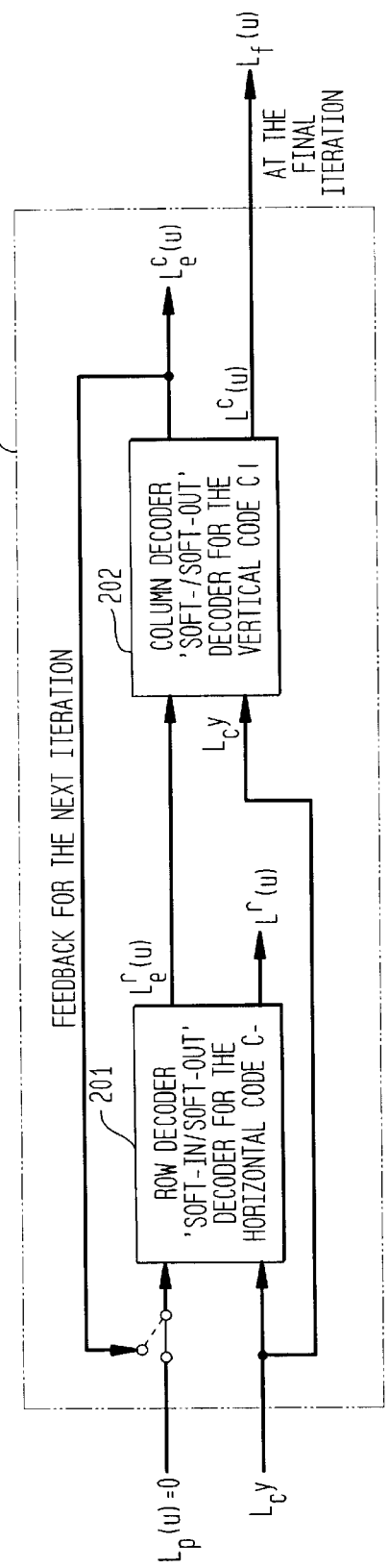
FIG. 2 shows a block diagram of an iterative decoder for decoding product codes operating in accordance with an exemplary embodiment of the present invention.

A "soft-in, soft-out" decoder 200 operating in accordance with an exemplary embodiment of the present invention is shown in FIG. 2. Decoder 200 receives the sample values $L_c \bullet y$ from a transmission medium as well as a priori reliability values $L_p(u)$ for the information bits u. The a priori reliability values $L_p(u)$ may be 0 for the first iteration, or, after the first iteration, the soft decision "extrinsic" reliability values $L_e(u)$ for the information bits L(u) from a previous iteration. The iterative decoder may employs a maximum, a posteriori (MAP) decoder for each dimension, each dimension corresponding to a block encoding with a component code.

For each iteration of the 2-dimensional case, decoder 200 completes a decoding operation for each component code of the product code. Therefore, for the exemplary parity check product code, row decoder 201 completes decoding of horizontal (row) values to generate output a posteriori row reliability values $L^r(u)$, then column decoder 202 completes decoding of vertical (column) values to generate output a posteriori column reliability values $L^c(u)$ before advancing to the next iteration. Each component code decoder (e.g., row and column decoders 201 and 202) receives the sample values $L_c \bullet y$ for decoding. As shown in FIG. 2, the extrinsic reliability values $L^r_e(u)$ generated by row decoder 201 may be employed sequentially as a priori reliability values for the next component code decoder, shown as column decoder 202. The extrinsic reliability values $L^c_e(u)$ generated by column decoder 202 may then be fed back to the row decoder 201 as a priori reliability values $L_p(u)$ for the next iteration. For the last iteration, the output a posteriori reliability values of the last component code decoder (e.g., a posteriori reliability values $L^c(u)$ of column decoder 202) are provided as the final decision values $L_f(u)$ corresponding to the decoded sample values.

FIG. 3 shows a flow diagram of an exemplary method of generating updated reliability values. The exemplary method may generate updated reliability values, such as updated a posteriori reliability values or updated extrinsic reliability values, for a current iteration of a soft-in, soft-out iterative decoder (such as that shown in FIG. 2) operating in accordance with the exemplary embodiment of the present invention.

At step 301, the variables for the magnitude and sign of the updated reliability values are initialized using, for example, the magnitude and sign of the dimension's parity bit. As would be apparent to one skilled in the art, the variables may be initialized with any of the reliability values for the dimension from the previous iteration. At step 302, the method searches for the first and second minimum magnitude values $m_1$ and $m_2$ of the previous reliability values for the dimension. For the exemplary decoder of FIG. 2, the method searches each row (if the iterative decoder is decoding in the horizontal direction) or column (if the iterative decoder is decoding in the vertical direction). Since the sign for the updated reliability value is calculated separately, the variable corresponding to the sign may also be updated (incremented) during the search process.

At step 303, a next reliability value for the dimension from the previous iteration is selected, which may be, for example, the first reliability value after the reliability value corresponding to the parity bit. At step 304, a test determines whether the magnitude of the previous reliability value is greater than $m_1$ (i.e., $|L(u_{ij})|>m_1$). If the test of step 304 determines $|L(u_{ij})|>m_1$, the magnitude of the updated reliability value $|L(u_{ij})|$ is set at step 305 as the value $m_1$. If the test of step 304 determines $|L(u_{ij})| \leq m_1$, the magnitude of the updated reliability value $|L(u_{ij})|$ is set as the value $m_2$ at step 306.

Once the magnitude of the updated reliability value is determined, the sign of the updated reliability value $L(u_{ij})$ is generated at step 307. The complete, updated reliability value $L(u_{ij})$ is then provided at step 308. At step 309, a test determines whether the last reliability value for the dimension has been updated. If the test at step 309 determines that the last reliability value for the dimension has not been updated, then the method returns to step 303; otherwise, the method ends and the updated reliability values are available for subsequent processing.

The following pseudo-code illustrates the exemplary method of updating reliability values for each row when decoding in the horizontal (row) direction using $K_1$ comparisons for $K_2$ rows for the exemplary iterative decoder of FIG. 2 implementing an exemplary method such as shown in FIG. 3:

/*Initialize both $m_1$ and $m_2$ by the magnitude of the row parity bit $|L(p_i^r)|$; and initialize sign variables by sign of the parity bit $L(p_i^r)$*/.
$m_1 = |L(p_i^r)|$
$m_2 = |L(p_i^r)|$
s=sign $L(p_i^r)$*/.
For j=1,2, . . . $k_1$.
/*Compare $|L(u_{ij})|$ with $m_1$ to find minimum value*/.
 if $|L(u_{ij})| < m_1$
  $m_2 = m_1$
  $m_1 = |L(u_{ij})|$
 else if $|L(u_{ij})| < m_2$,
  $m_2 = |L(u_{ij})|$
/*Update sign of the reliability value*/.
s=s x sign $L(u_{ij})$
For j=1,2, . . . $K_1$.
/*Assign a new updated reliability value for j—1,2, . . . $K_1$*/.
$|L(u_{ij})| = m_1$ if $|L(u_{ij})| > m_1$
$|L(u_{ij})| = m_2$ otherwise
/*Provide the updated reliability value with magnitude and sign*/
$L(u_{ij}) = |L(u_{ij})|(s \times sign(L(u_{ij})))$.

For an iteration of decoding in the vertical (column) direction, the exemplary method operates in a similar manner and uses $K_2$ comparisons for $K_1$ rows. Consequently, the exemplary method performs $(K_1 K_2 + K_1 K_2)$ comparisons when decoding $K_1 \cdot K_2$ information bits of a rectangular matrix u with row- and column-wise parity bit vectors $p^r$ and $p^c$. For the exemplary 2-dimensional parity check product code, a circuit implementation of an interative decoder may use $(K_1 K_2 + K_1 K_2)$ comparators rather than $(K_1^2 K_2 + K_1 K_2^2)$ comparators as required in prior art decoders. Reducing the number of comparators provides several advantages, such as reduced 1) circuit complexity, 2) power consumption, 3) area in an integrated circuit, and 4) decoding delay.

While the exemplary embodiments of the present invention have been described with respect to processes of circuits, the present invention is not so limited. As would be apparent to one skilled in the art, various functions of circuit elements may also be implemented in the digital domain as processing steps in a software program. Such software may be employed in, for example, a digital signal processor, micro-controller or general purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims

What is claimed is:

1. A method of generating an updated set of reliability values in an iterative decoder for a dimension comprising the steps of:

(a) searching a current set of reliability values in a dimension of block-encoded data to 1) identify first and second minimum magnitude reliability values and 2) update each sign of the current set of reliability values;

(b) comparing the magnitude of each current reliability value to the first minimum magnitude value, and, if the current reliability value is greater than the first minimum magnitude value, setting the magnitude of the updated reliability value corresponding to the current reliability value to the first minimum magnitude value;
   otherwise, setting the magnitude of the updated reliability value corresponding to the current reliability value to the second minimum magnitude value; and (c) associating the sign bit with the magnitude set for each reliability value to provide an updated reliability value.

2. The invention recited in claim 1, further comprising the step of (d) repeating steps a) through c) for each dimension of the block-encoded data.

3. The invention recited in claim 2, further comprising the step of (e) decoding each dimension of block encoded data in accordance with the set of updated reliability values for the dimension.

4. The invention as recited in claim 3, wherein step (e) decodes each dimension employing the set of updated reliability values generated by implementing steps (a) through (e) for at least one previous dimension.

5. An iterative decoder including a circuit for generating an updated set of reliability values for a dimension comprising:
   a first comparator comparing each of a current set of reliability values in a dimension of block-encoded data to identify first and second minimum magnitude reliability values;
   a register storing each sign of the current set of reliability values, the sign updated based on the current set of reliability values for the dimension;
   a second comparator comparing the magnitude of each current reliability value to the first minimum magnitude value, wherein
      if the current reliability value is greater than the first minimum magnitude value, the magnitude of the updated reliability value corresponding to the current reliability value is set to the first minimum magnitude value;
      otherwise, the magnitude of the updated reliability value corresponding to the current reliability value is set to the second minimum magnitude value; and
   a logic circuit associating the sign bit with the stored magnitude set for each reliability value to provide an updated reliability value.

6. The invention as recited in claim 5, wherein the step of d) repeating steps a) through c) for each dimension of the block encoded data.

7. The invention recited in claim 6, wherein each dimension of block encoded data is decoded in accordance with the set of updated reliability values for the dimension.

8. The invention as recited in claim 7, wherein, for each dimensin, the iterative decoder employs the set of updated reliability values generated for at least one previous dimension.

9. The invention as recited in claim 5, wherein the circuit is embodied in an integrated circuit.

10. The invention as recited in claim 5, wherein the iterative decoder employs a maximum, a posteriori decoder for each dimension, each dimension corresponding to a block encoding with a component code.

11. The invention as recited in claim 5, wherein the circuit is embodied in either a wireless telecommunications receiver or a magnetic recording system.

12. A computer-readable medium having stored thereon a plurality of instructions, the plurality of instructions including instructions which, when executed by a processor, cause the processor to implement a method for generating an updated set of reliability values in an iterative decoder for a dimension, the method comprising the steps of:
   a) searching a current set of reliability values in a dimension of block-encoded data to 1) identify first and second minimum magnitude reliability values and 2) update each sign of the current set of reliability values;
   b) comparing the magnitude of each current reliability value to the first minimum magnitude value, and,
      if the current reliability value is greater than the first minimum magnitude value, setting the magnitude of the updated reliability value corresponding to the current reliability value to the first minimum magnitude value;
      otherwise, setting the magnitude of the updated reliability value corresponding to the current reliability value to the second minimum magnitude value; and
   c) associating the sign bit with the magnitude set for each reliability value to provide an updated reliability value.

13. The invention recited in claim 12, further comprising the step of d) repeating steps a) through c) for each dimension of the block-encoded data.

14. The invention recited in claim 13, further comprising the step of e) decoding each dimension of block encoded data in accordance with the set of updated reliability values for each dimension.

15. The invention as recited in claim 14, wherein step (e) decodes each dimension employing the set of updated reliability values generated by implementing steps (a) through (e) for at least one previous dimension.

* * * * *